US008680861B1

(12) United States Patent
Morrone

(10) Patent No.: US 8,680,861 B1
(45) Date of Patent: *Mar. 25, 2014

(54) SYSTEM AND METHOD FOR MULTISLICE FAST MAGNETIC RESONANCE IMAGING

(75) Inventor: Terry Morrone, Greenlawn, NY (US)

(73) Assignee: Fonar Corporation, Melville, NY (US)

( * ) Notice: Subject to any disclaimer, the term of this patent is extended or adjusted under 35 U.S.C. 154(b) by 121 days.

This patent is subject to a terminal disclaimer.

(21) Appl. No.: 13/287,080

(22) Filed: Nov. 1, 2011

Related U.S. Application Data

(63) Continuation of application No. 12/498,009, filed on Jul. 6, 2009, now Pat. No. 8,049,498, which is a continuation of application No. 11/808,449, filed on Jun. 11, 2007, now Pat. No. 7,557,576, which is a continuation of application No. 11/154,958, filed on Jun. 17, 2005, now Pat. No. 7,230,424.

(51) Int. Cl.
*G01V 3/00* (2006.01)
(52) U.S. Cl.
USPC .......................................... 324/309; 324/312
(58) Field of Classification Search
USPC ......................................... 324/309, 312, 314
See application file for complete search history.

(56) References Cited

U.S. PATENT DOCUMENTS

| 5,073,752 | A | * | 12/1991 | DeMeester et al. | 324/309 |
| 5,349,292 | A | * | 9/1994 | Sugiura | 324/309 |
| 5,742,163 | A | * | 4/1998 | Liu et al. | 324/309 |
| 6,043,652 | A | * | 3/2000 | Liu | 324/309 |
| 6,614,225 | B1 | * | 9/2003 | Feinberg | 324/307 |
| 7,557,576 | B1 | * | 7/2009 | Morrone | 324/314 |
| 8,049,498 | B1 | * | 11/2011 | Morrone | 324/309 |

* cited by examiner

*Primary Examiner* — Louis Arana
(74) *Attorney, Agent, or Firm* — Van Dyke Law; Raymond Van Dyke

(57) ABSTRACT

Through advancing the phase of radio frequency (RF) excitation with each phase-encoding level, a method, apparatus and article thereof increases the effectiveness of a Magnetic Resonance Imaging (MRI) device by correcting for main magnetic field inhomogeneities without noticeably decreasing the signal-to-noise (SNR) ratio. Increased effectiveness of fast imaging with steady precession (FISP) scans and using FISP scans to image multiple slices. In an MRI device, a patient is subjected to a constant magnetic field, and RF pulses are used to excite the nuclei in the patient's body, which release a corresponding RF signal as the nuclei relax, which is measured and mapped into a visual display. The RF pulses used to excite the nuclei cooperate with a slice select gradient and a phase-encoding gradient. When the RF pulse is phase shifted with each phase-encoding gradient level, improved SNR ratios are observed.

24 Claims, 13 Drawing Sheets

SYSTEM AND METHOD FOR MULTISLICE FAST MAGNETIC RESONANCE IMAGING

CROSS-REFERENCE TO PRIOR APPLICATIONS

This application is a Continuation of U.S. patent application Ser. No. 12/498,009, filed Jul. 6, 2009, now U.S. Pat. No. 8,049,498, which is a Continuation of U.S. patent application Ser. No. 11/808,449, filed Jun. 11, 2007, now U.S. Pat. No. 7,557,576, which is a Continuation of U.S. patent application Ser. No. 11/154,958, filed Jun. 17, 2005, now U.S. Pat. No. 7,230,424.

TECHNICAL FIELD

The technical field generally relates to magnetic resonance imaging. More specifically, the invention relates to a method for improving the efficiency of a magnetic resonance imaging apparatus by utilizing a multi-slice fast magnetic resonance imaging sequence and advancing the phase of the radio frequency excitation with each warp level to correct artifacts and improve the signal-to-noise ratio of the resulting images.

BACKGROUND OF THE INVENTION

Magnetic resonance imaging (MRI), also called nuclear magnetic resonance imaging (NMR imaging), is a non-invasive method for the analysis of materials and is used extensively in medical imaging. It is non-destructive and does not use ionizing radiation. In general terms, nuclear magnetic moments of nuclei in the imaged material are excited at specific spin precession frequencies, which are proportional to an external magnetic field. Radio frequency (RF) signals resulting from the precession of these spins are collected using receiver coils. By manipulating the magnetic fields, signals are collected that represent different regions of the volume under study. These signals are combined to produce a volumetric image of the nuclear spin density of the object.

In MRI, a body is subjected to a constant main magnetic field $B_0$. Another magnetic field, in the form of electromagnetic radio frequency (RF) pulses, is applied orthogonally to the constant magnetic field. The RF pulses have a particular frequency that is chosen to affect particular nuclei (typically hydrogen) in the body. The RF pulses excite the nuclei, increasing the energy state of the nuclei. After the pulse, the nuclei relax and release RF energy as a free induction decay (FID) signal, which can be transformed into an echo signal. The echo signals are detected, measured, and processed into images for display. The RF pulses may have a broad frequency spectrum to excite nuclei over a large range of resonant frequencies, or the RF pulses may have a narrow frequency spectrum to excite a nuclei over a more narrow range of resonant frequencies.

Composite RF pulses may be used to excite nuclei over different ranges of resonant frequencies. In this manner, composite RF pulses may be transmitted to excite multiple ranges of resonant frequencies, thereby allowing for collection of received signals from multiple areas of interest, such as multiple slices, simultaneously.

When hydrogen nuclei relax, the frequency that they emit is positively correlated with the strength of the magnetic field surrounding them. For example, a magnetic field gradient along the z-axis, called the "slice select gradient," is set up when the RF pulse is applied, and is shut off when the RF pulse is turned off. This gradient causes the hydrogen nuclei at the high end of the gradient (where the magnetic field is stronger) to precess at a high frequency (e.g., 26 MHz), and those at the low end (weaker field) to precess at a lower frequency (e.g., 24 MHz). When a narrow-banded RF pulse is applied, only those nuclei which precess at that particular frequency will be tilted, to later relax and emit a radio transmission. That is, the nuclei "resonate" to that particular frequency. For example, if the magnetic gradient caused hydrogen nuclei to precess at rates from 24 MHz at the low end of the gradient to 26 MHz at the high end, and the gradient were set up such that the high end was located at the patient's head and the low end at the patient's feet, then a 24 MHz RF pulse would excite the hydrogen nuclei in a slice near the feet, and a 26 MHz pulse would excite the hydrogen nuclei in a slice near the head. When a single "slice" along the z-axis is selected, only the protons in this slice are excited by the specific RF pulse to a higher energy level, to later relax to a lower energy level and emit a radio frequency signal.

The second dimension of the image is extracted with the help of a phase-encoding gradient. Immediately after the RF pulse ceases, all of the nuclei in the activated higher energy level slice are in phase. Left to their own devices, these vectors would relax. In MRI, however, the phase-encoding gradient (in the y-dimension) is briefly applied in order to cause the magnetic vectors of nuclei along different portions of the gradient to have a different phase advance. Typically, the sequence of pulses is repeated to collect all the data necessary to produce an image. As the sequence of pulses is repeated, the strength of the phase-encoding gradient is stepped, as the number of repetitions progresses. For example, the phase-encoding gradient may be evenly incremented after each repetition. These steps of the phase-encoding gradient are also referred to as "warp levels." The number of repetitions of the pulse sequence is determined by the type of image desired and can be any integer, typically from 1 to 1024, although additional phase encoding steps are utilized in specialized imaging sequences. The polarity of the phase encoding gradient may also be reversed to collect additional RF signal data. For example, when the number of repetitions is 1024, for 512 of the repetitions, the phase encoding gradient will be positive. Correspondingly, for the other 512 repetitions, a negative polarity phase encoding gradient of the same magnitude is utilized.

After the RF pulse, slice select gradient, and phase-encoding gradient have been turned off, the MRI instrument sets up a third magnetic field gradient, along the x-axis, called the "frequency encoding gradient" or "read-out gradient." This gradient causes the relaxing protons to differentially precess, so that the nuclei near one end of the gradient begin to precess at a faster rate, and those at the other end precess at an even faster rate. Thus, when these nuclei relax, the fastest ones (those which were at the high end of the gradient) will emit the highest frequency RF signals. The frequency encoding gradient is applied only when the RF signals are to be measured. The second and third dimensions of the image are extracted by means of Fourier transformation. Fourier transformation, or Fast Fourier transformation, permits the received RF signal to be decomposed into a sum of sine waves, each of different frequency, phases and amplitudes. For example, $$S(t) = a_0 + a_1 \sin(\omega_1 t + \phi_1) + a_2 \sin(\omega_2 t + \phi_2) +$$

Alternatively, the amplitude of the received RF signal may be shown to decay exponentially, as represented by:

$$A = A_0 e^{\frac{-t}{T_2}}$$

where t is time, $A_0$ is the initial amplitude of the received signal, and the $$e^{\frac{-t}{T_2}}$$

term is the decay constant that depends upon the uniformity of the main magnetic field, $B_0$.

The Fourier transformation of the signal in the time domain can be represented in the equivalent frequency domain by a series of peaks of various amplitudes. In MRI, the signal is spatially encoded by changes of phase and frequency, which is then decomposed by performing a two-dimension Fourier transform to identify pixel intensities across the image.

While the z-axis was used as the slice-select axis in the above example, similarly, either the x-axis or y-axis may be set up as the slice-select axis depending upon the desired image orientation and the anatomical structure of the object of interest being scanned. For example, when a patient is positioned in the main magnetic field, one axis is utilized as the slice-select axis to acquire sagittal images, and another axis is utilized as the slice-select axis to acquire coronal images.

Regardless of the orientation of the selected scan, mathematically, the slice select gradient, phase-encoding gradient, and read-out gradient are orthogonal. The result of the MRI scan in the frequency domain representation (k-space) is converted to image display in the time domain data after a 2D or 3D Fast Fourier transform (FFT). Generally, in a transverse slice, the readout gradient is related to the $k_x$ axis and the phase-encoding gradient is related to the $k_y$ axis. In 3D MRI, an additional phase-encoding gradient is related to the $k_z$ axis to acquire data in a third dimension. When the number of phase-encoding levels is smaller than a binary number, the missing data may be filled with zeros to complete the k-space so that an FFT algorithm may be applied.

In k-space, data is arranged in an inhomogeneous distribution such that the data at the center of a k-space map contains low spatial frequency data, that is, the general spatial shape of an object being scanned. The data at the edges of the k-space map contains high spatial frequency data including the spatial edges and details of the object.

The more uniform the main magnetic field $B_0$, and the more uniform the frequency of the gradients and RF pulses, the higher the resulting image quality, because the precessing nuclei become de-phased more quickly when subjected to non-uniform magnetic fields. The main magnetic field, the gradient magnetic fields, and the frequency composition of the RF excitation pulse may all cause quicker de-phasing if any of these elements are non-uniform.

In magnetic resonance imaging, for the same set of scan parameters, a shorter scan tends to reduce the signal-to-noise ratio (SNR), while a longer scan, which would have a correspondingly larger k-space map, tends to increase the signal-to-noise ratio as well as image quality. Ideally, a fast scan with a high signal-to-noise ratio is preferred.

The physical limitations, including signal-to-noise ratio (SNR) versus scan time, are balanced in a clinical environment, and MRI sequences are programmed to maximize image quality, including signal-to-noise ratios, image contrast, and the minimization of image artifacts. Attempts are made to minimize scan times, all the while minimizing the effects of any non-uniform magnetic fields in the main magnetic field, the gradient magnetic fields, and the RF pulse composition. Steady state free precession (SSFP) imaging sequences do not use a refocusing 180° RF pulse, and the data are sampled during a gradient echo, which is achieved by dephasing the spins with a negatively pulsed gradient before they are rephased by an opposite gradient with opposite polarity to generate the echo. Steady state free precession techniques often permit fast imaging with high signal-to-noise ratios, but they are susceptible to image artifacts due to inhomogeneities in the main $B_0$ magnetic field.

In order to capitalize on the fast imaging times afforded by steady-state free precession imaging sequences, artifacts resulting from main $B_0$ magnetic field inhomogeneities must be minimized. In this manner, fast scan times may be achieved with improved signal-to-noise ratios. However, none of the previous MRI imaging sequences and techniques provide adequate fast scan times, acceptable signal-to-noise measurements, and reduced-artifact images.

What is needed is a new type of MRI imaging sequence that provides acceptable fast scan times and signal-to-noise ratios, and eliminates steady-state free precession imaging artifacts.

SUMMARY OF THE INVENTION

The present invention provides a method and apparatus to increase the efficiency of a Magnetic Resonance Imaging (MRI) device by utilizing a multi-slice fast magnetic resonance imaging scan and advancing the phase of the radio frequency excitation with each warp level to correct artifacts and improve the signal-to-noise ratio. Image data from the scans is manipulated, and inverse Fourier transforms are performed to render images with increased signal-to-noise and full spectrum frequency response in a reduced acquisition time.

Through advancing the phase of the radio frequency (RF) excitation with each phase-encoding level, the present invention increases the effectiveness of an MRI device by correcting for main magnetic field inhomogeneities without noticeably decreasing the signal-to-noise ratio. The present invention also increases the effectiveness of fast imaging with steady precession (FISP) scans and allows FISP scans to image multiple slices. In an MRI device, a patient is subjected to a constant magnetic field, and RF pulses are used to excite the nuclei in the patient's body. The nuclei release a corresponding RF signal as the nuclei relax, which can be measured and mapped into a visual display. The RF pulses used to excite the nuclei in the body cooperate with a slice select gradient and a phase-encoding gradient. When the RF pulse is phase shifted with each phase-encoding gradient level, improved signal-to-noise ratios are observed.

The method of the present invention acquires a complete MRI data set of an anatomy of interest multiple times. During these multiple acquisitions, the present invention phase-shifts a composite RF pulse a predetermined amount during each acquisition. A multi-lobed composite RF pulse is employed to excite multiple anatomical slices simultaneously. The data sets depicting these slices are then reconstructed to yield intermediate images. The intermediate images are separated into discrete data files, where all but one of the intermediate images are replaced by null values, yielding altered data sets. Two inverse Fourier transforms are performed on the altered data sets resulting in one new data set for each slice. The data sets are summed for each slice and reconstructed to produce images with reduced artifacts and improved signal-to-noise ratios (SNRs).

BRIEF DESCRIPTION OF THE DRAWINGS

The features, aspects, and advantages of the present invention will become better understood with regard to the following description, appended claims, and accompanying drawings, where:

DETAILED DESCRIPTION OF THE PRESENT INVENTION

Figure 1A:
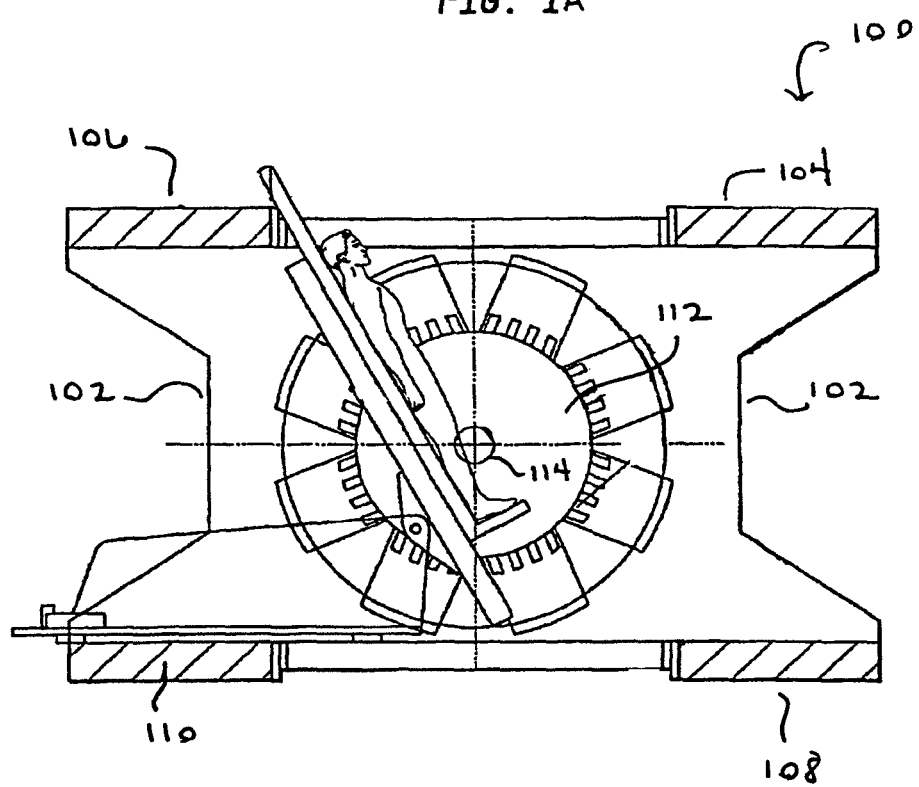
FIGS. 1A-1B generally illustrate an exemplary MRI apparatus.

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

The present invention is a Magnetic Resonance Imaging (MRI) method and apparatus that collects multiple slices simultaneously. Multiple slices are acquired in the same amount of scan time with improved signal-to-noise ratio per unit scan time. Signal-to-noise ratio is an indicator of image quality. By advancing the phase of the radio frequency (RF) pulse by different amounts for each slice and using the reconstruction techniques of the present invention, scan times may be reduced without noticeable degradation of image quality, or image quality may be improved for scans of the same duration. The present invention will be described in detail herein below.

In a known technique, Phase Offset MultiPlanar volume imaging (POMP), two or more slices are excited at the same time and the RF is phase advanced by different amounts for each slice. In the simplest case, two slices are excited at once, by using an RF pulse with two frequency bands. The first slice has zero phase advance per warp while the second has a 180° phase advance per warp. To see the effect, consider that the warp gradient introduces into the NMR signal a factor:

$$e^{i\gamma G_y T_y m y}$$

where m is the warp number. The gradient $G_y$ is on for $T_y$ seconds. The variable y is position, $\gamma$ is the gyromagnetic ratio, and i is the imaginary number $\sqrt{-1}$. The molecules at position y experience a phase advance of:

$$\gamma G_y T_y m$$

with each warp. If a discrete Fourier transform is taken with respect to m, the resulting $p^{th}$ component of the transform is:

$$A\rho = \sum_{m=\frac{-M}{2}}^{\frac{M}{2}-1} e^{i\gamma G_y T_y m y} e^{\frac{-2\pi i m p}{M}}$$

where M is the magnetization vector. The result is integrated over y. The summation amplitude is significant when:

$$\gamma G_y T_y y = 2\pi \rho/M$$

or, as alternatively represented:

$$\rho = \frac{\gamma G_y}{2\pi} T_y y$$

Substituting $g_y$ for $\gamma G_y/2\pi$ yields:

$$\rho = g_y T_y y$$

If, in addition to the phase advance from the gradient, an RF phase shift of $\theta$ per warp is added, then instead of the above equation, the following relationship exists:

$$A\rho = \sum e^{i\gamma G_y T_y m y} e^{i m \theta 2\pi} e^{\frac{i m p}{N}}$$

yielding:

$$p = g_y T_y y + M\theta/2\pi$$

where the $M\theta/2\pi$ term represents the pixel shift.

If $\theta$ is $\pi$, the pixel shift is M/2. Thus, two displaced images are generated, one from each slice. Scan parameters must be further considered and adjusted to ensure that the resulting images do not overlap.

The preferred embodiment utilizes the displaced images and incorporates them further into a method for eliminating stimulated echoes, similar to techniques used in a fast imaging, steady-state free precession (FISP) scan. FISP scans attempt to combine signals observed separately in the fast acquisition dual echo sequences and are desirable because they compensate for motion and take little time. However, FISP scans are single slice techniques.

To reduce artifacts, any transverse magnetization still present at the time of subsequent RF pulses is incorporated into the steady state. Perpendicular magnetization after an RF pulse can be written as:

$$M_t(t=0) = \Sigma A_n e^{i n \Phi}$$

where $\Phi$ is the integral of the applied and background magnetic fields during one TR or time-between-repetitions, $M_t$ is the magnetization vector, n is an integer, and $A_n$ is the initial amplitude of the magnetization vector.

$$\Phi = \int_0^{TR} \omega(t) dt$$

In FISP, the gradient term in $\omega(t)$, that is the angular velocity that vector $M_t$ precesses around the z-axis, integrates to zero. However, the background (or static) field term, that is, the deviation from a constant, cannot be made zero. As MRI scanner and magnet technology have improved over time, main magnetic field homogeneity has improved. As such, in some MRI systems utilizing through-bore superconducting magnets, the background field term above can be made negligible. In open MRI systems, and those other MRI systems that utilize non-traditional main magnetic field patterns, the background field term cannot be made negligible. The method of the present invention will be most useful when the background field term is significant.

Each term in equation (1) gives rise to an echo. Consider:

$$M_1(t) = e^{-\frac{t}{T_2}} \sum_{n=-\infty}^{n=+\infty} A_n e^{i[n\Phi+\phi(t)]}$$

where $\phi(t)$ is the gradient term, i.e., of $\gamma$ Gdt. When $\phi(t)=n\Phi$, an echo occurs. The echoes interfere and produce artifacts.

To remove the artifacts, the unwanted echoes must be removed. Conventional scan techniques have focused on performing a series of scans with a different RF phase during each TR. For N scans, the phase shift for the $j^{th}$ scan is:

$$\Psi_j = 2\pi j/N$$

For example, when N=4, the phase shifts are 0, 90, 180, and 270 degrees, respectively.

After the data from the four scans is collected, an n point DFT (Discrete Fourier Transform) with respect to j is executed. Typically, only the zeroth component is retained. With the additional RF phase shift:

$$\Phi \rightarrow \Phi + 2\pi j/N$$

$$n\Phi \rightarrow n\Phi + 2\pi jn/N$$

Thus, $$M_\rho = \sum_{n,j} A_n e^{-\frac{i2\pi pj}{N}} e^{in\Phi} e^{i\phi(t)} e^{\frac{ij2\pi n}{N}}$$

when DFT over j yields $\delta(n-p)$ and aliasing terms, i.e., $$\delta(n-p\pm lN)$$

where l is an integer and $\delta$ refers to the delta function.

Empirically, the aliasing terms have little effect for N sufficiently large. N=4 is sufficient in the present invention, although larger values yield corresponding benefits with regard to aliasing reduction.

After the DFT:

$$M_p = A_p e^{ip\Phi} e^{i\phi(\tau)}$$

the term $M_o$ is used. $M_o$ may be obtained by simply summing up the N scans. The sum over n is thus removed, and only one echo occurs when $\phi(t)=0$.

The present invention combines the fast acquisition and low signal-to-noise ratio of FISP scans with the multi-slice technique of POMP imaging. As described below, the present invention further increases the image quality and artifact reduction of a FISP scan by incorporating a multi-slice method.

Figure 1B:
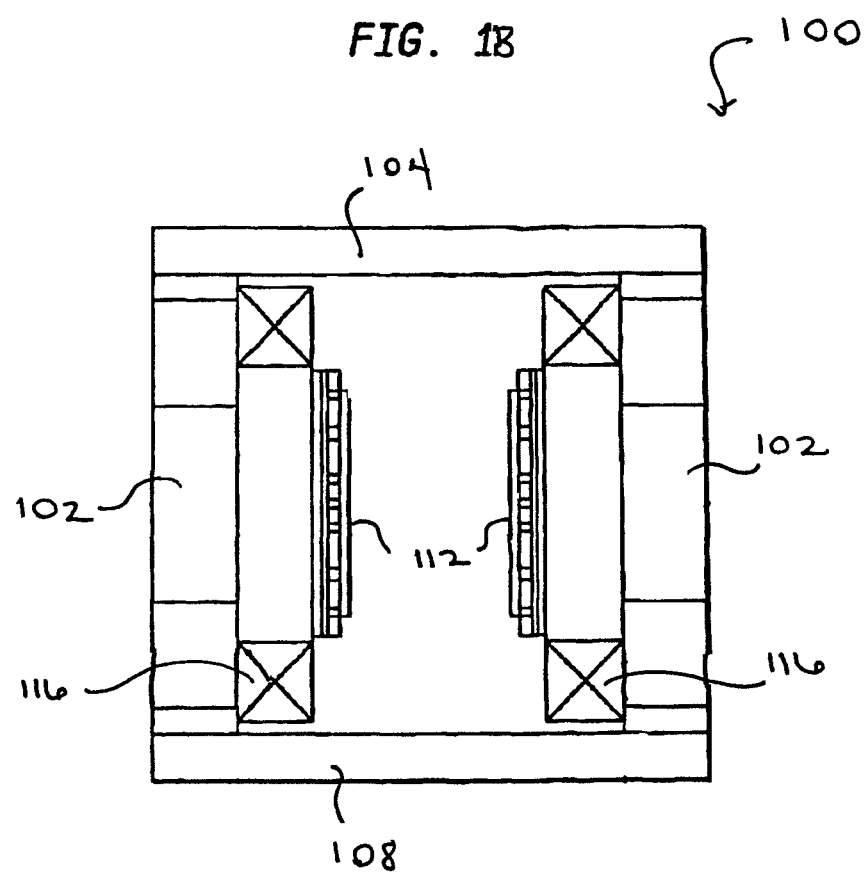

An exemplary MRI apparatus is shown in FIGS. 1A and 1B. In an open MRI 100, as shown in FIGS. 1A and 1B, a magnet structure includes a pair of vertically extending sidewalls 102 and an upper flux return structure including a pair of flux return members 104 and 106 extending between sidewalls 102. The lower flux return structure includes a similar pair of flux return members 108 and 110. A pair of round, generally cylindrical ferromagnetic poles 112 project inwardly from the opposed sidewalls 102 along a magnet axis or pole axis 114. A flux source is also provided, in this example including coils 116, illustrated in FIG. 1B, which may be resistive or super-conducting coils surrounding the poles or may be permanent magnet material, as is understood in the art. In a possible variant, the upper and lower flux return members, 104, 106, 108 and 110 may not necessarily include pairs, as is described hereinabove. In particular the upper and lower flux return members may include a single member that is positioned and sized to provide an adequate flux return path.

A more detailed description of the exemplary MRI apparatus may be found in commonly-owned U.S. Pat. No. 6,828, 792. The MRI apparatus of the present invention is preferably an open MRI apparatus, or other non-traditional MRI apparatus, but the principles of the present innovation are just as applicable for any traditional MRI apparatus as well.

Figure 2A:
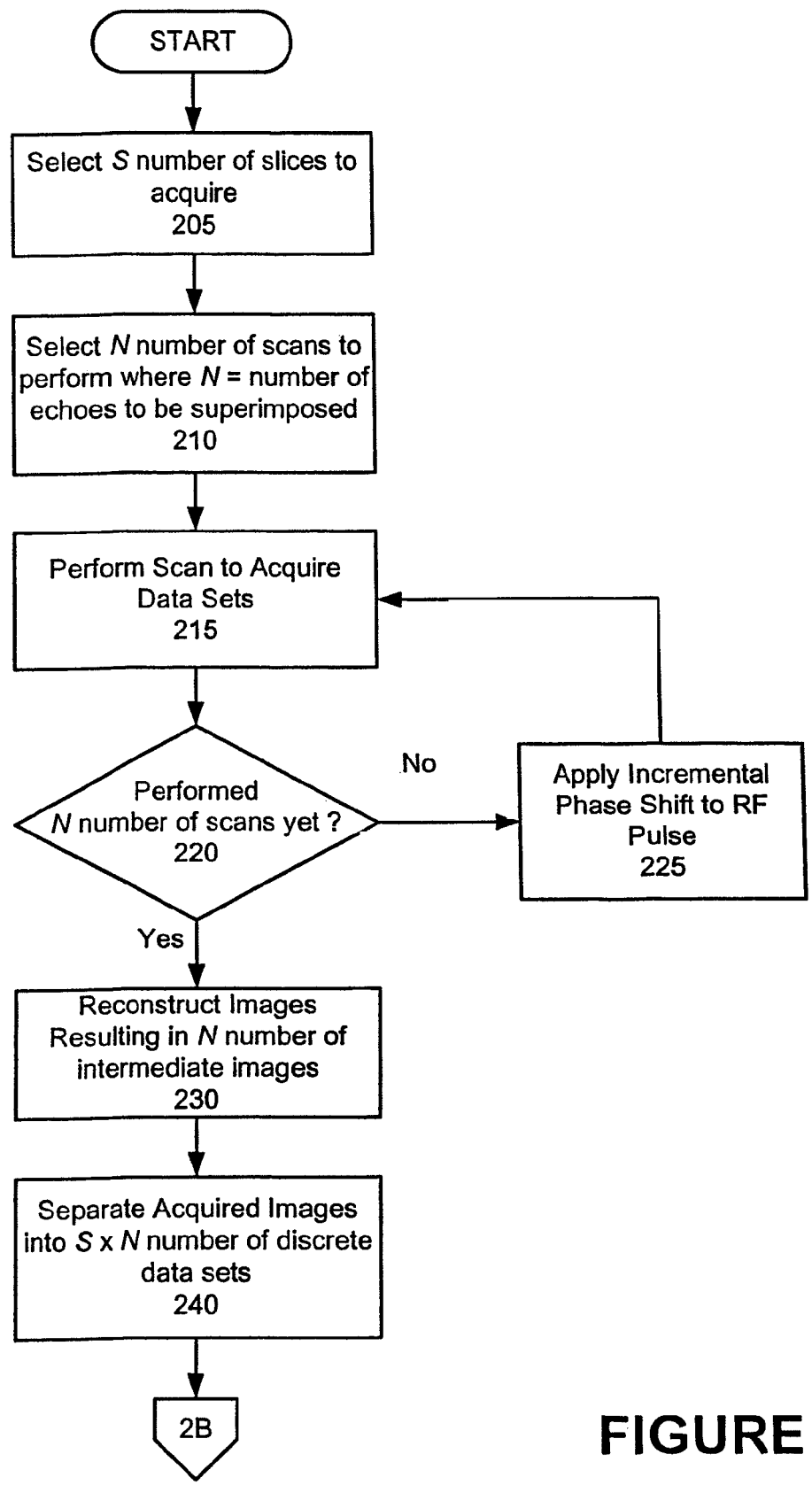
FIGS. 2A-2B illustrate a process flow diagram in accordance with a method of the present invention.

An exemplary sequence is illustrated below with regard to the present invention. Referring to FIG. 2A, a user starts by selecting the number of slices, S, at step 205. In the preferred embodiment, two or more slices are excited at the same time, and the RF pulse is phase advanced by different amounts for each slice. Consider the simplest case of two slices excited at once (by using an RF pulse with two frequency bands). The first slice has zero phase advance per warp while the second slice has a 180° phase advance per warp. Four scans are selected in step 210. The scans are performed (step 215) to eliminate the stimulated echoes, but two slices are excited simultaneously using RF pulses with advancing phase shifts in steps 220 and 225. The RF phase advance per echo is chosen as illustrated in TABLE 1 below.

TABLE 1

|      | Slice | |
| --- | --- | --- |
| Scan | 1 | 2 |
| 1 | 0 | 180 |
| 2 | 90 | 270 |
| 3 | 180 | 0 |
| 4 | 270 | 90 |

In performing this phase advance and Fourier transformation, two slices in the region of interest are excited simultaneously, and the system receives the emitted RF signal from both slices. Each image file contains data from both slices. By selecting large slice offsets, the images do not overlap, and may be displayed separately.

Figure 3A:
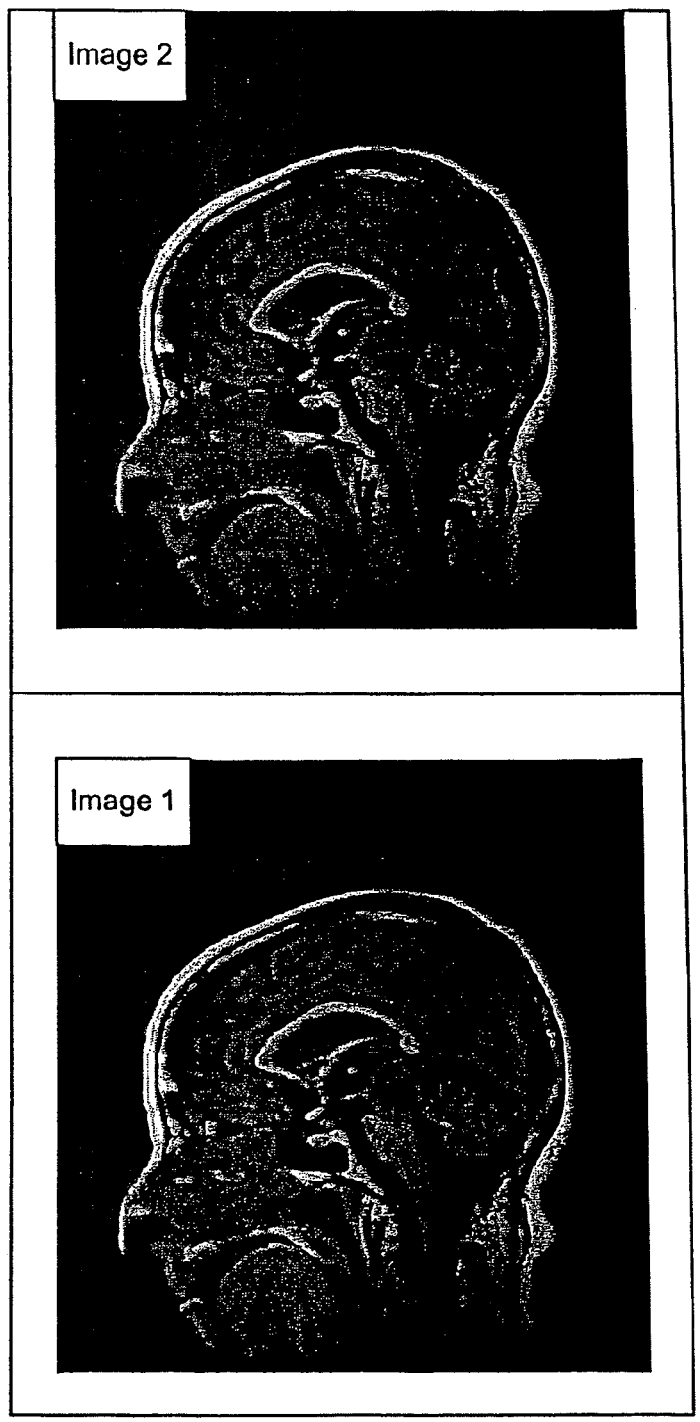
FIGS. 3A-3D illustrate four scans acquiring two intermediate images during each scan using a composite RF pulse in accordance with the present invention.
Figure 3B:
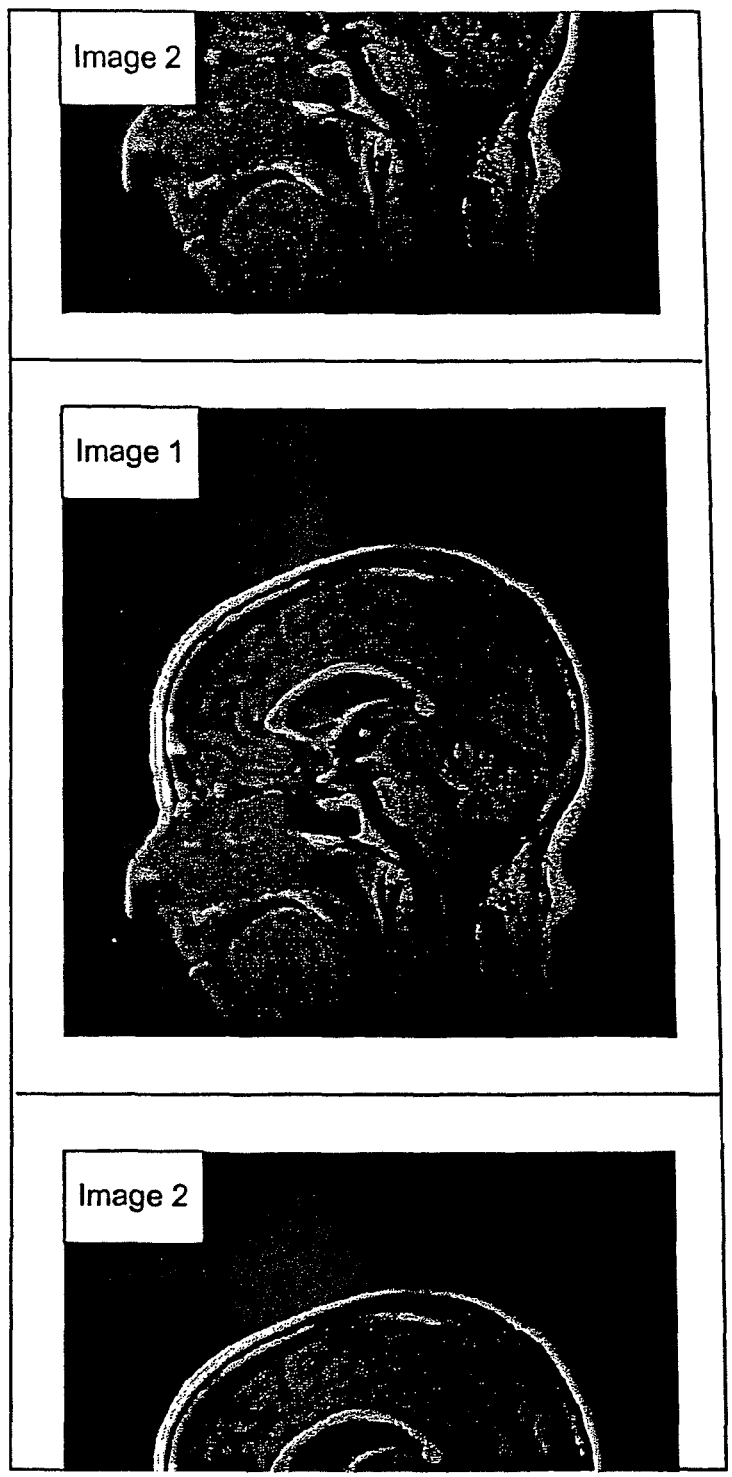
Figure 3C:
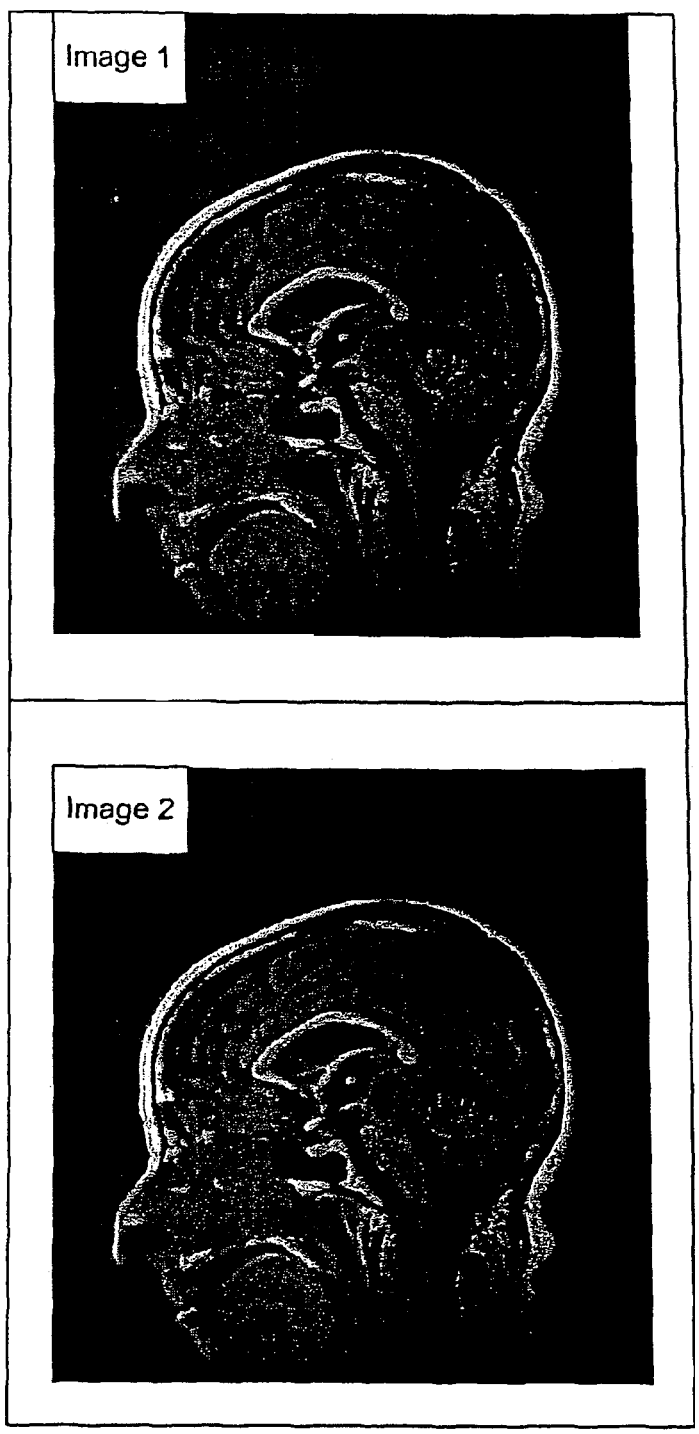
Figure 3D:
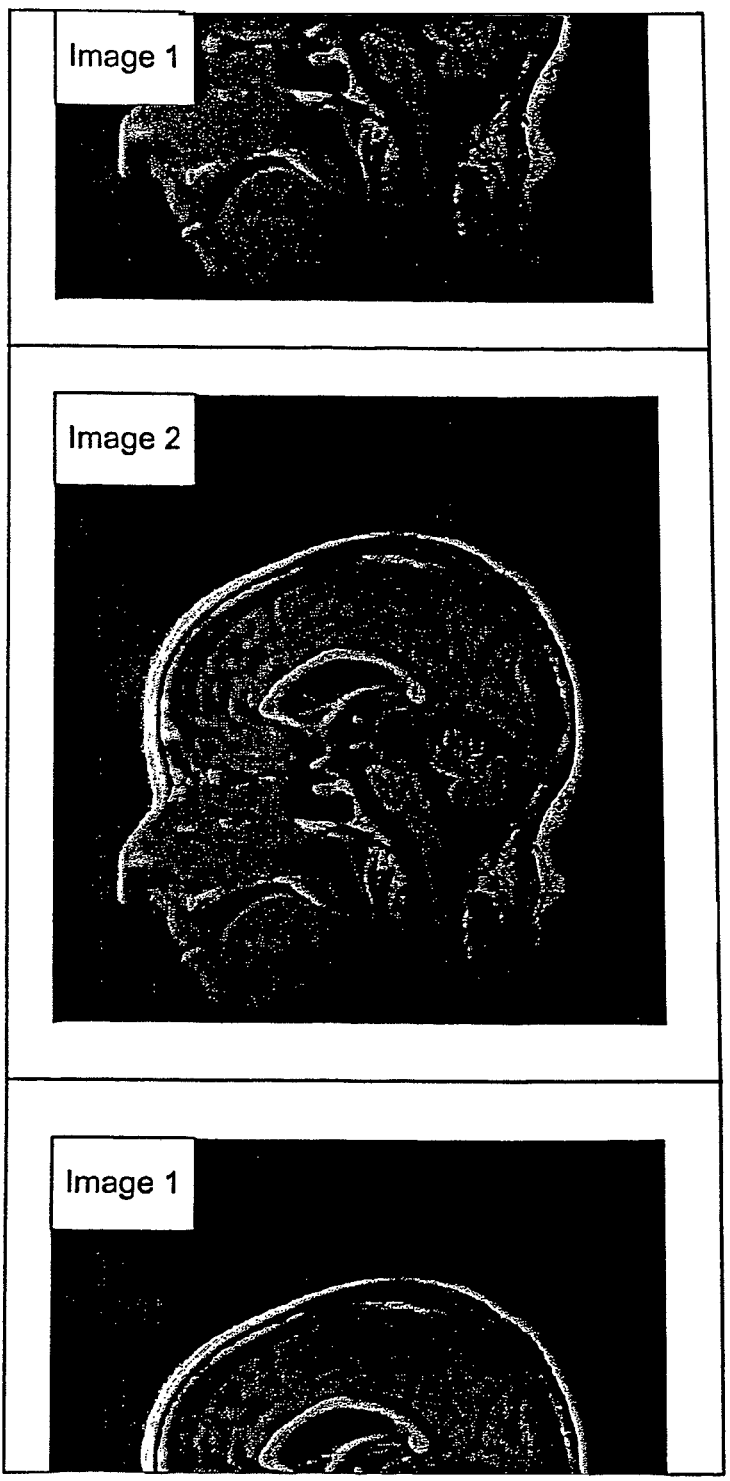
Figure 4A:
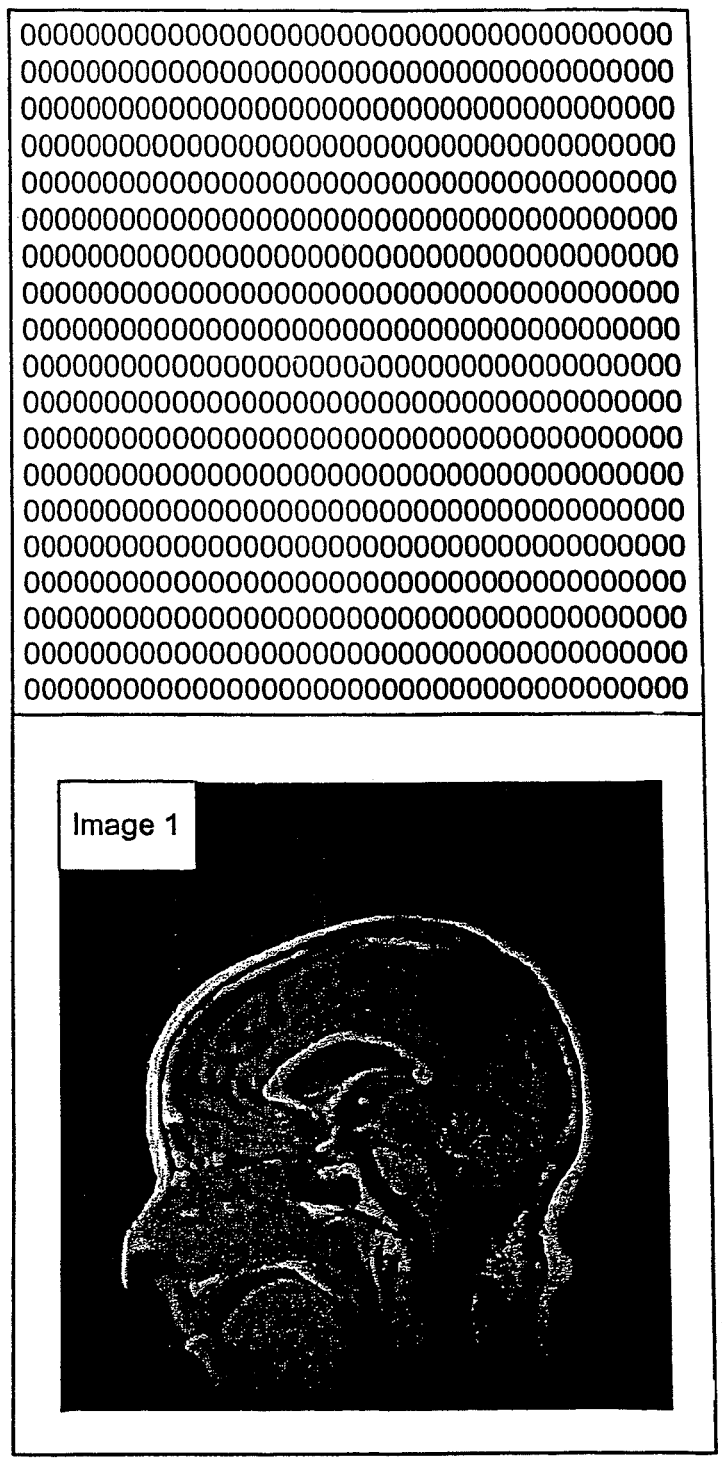
FIGS. 4A-4D illustrate the separation of the acquired intermediate images and zero-filling of the four scans in accordance with the present invention.
Figure 4B:
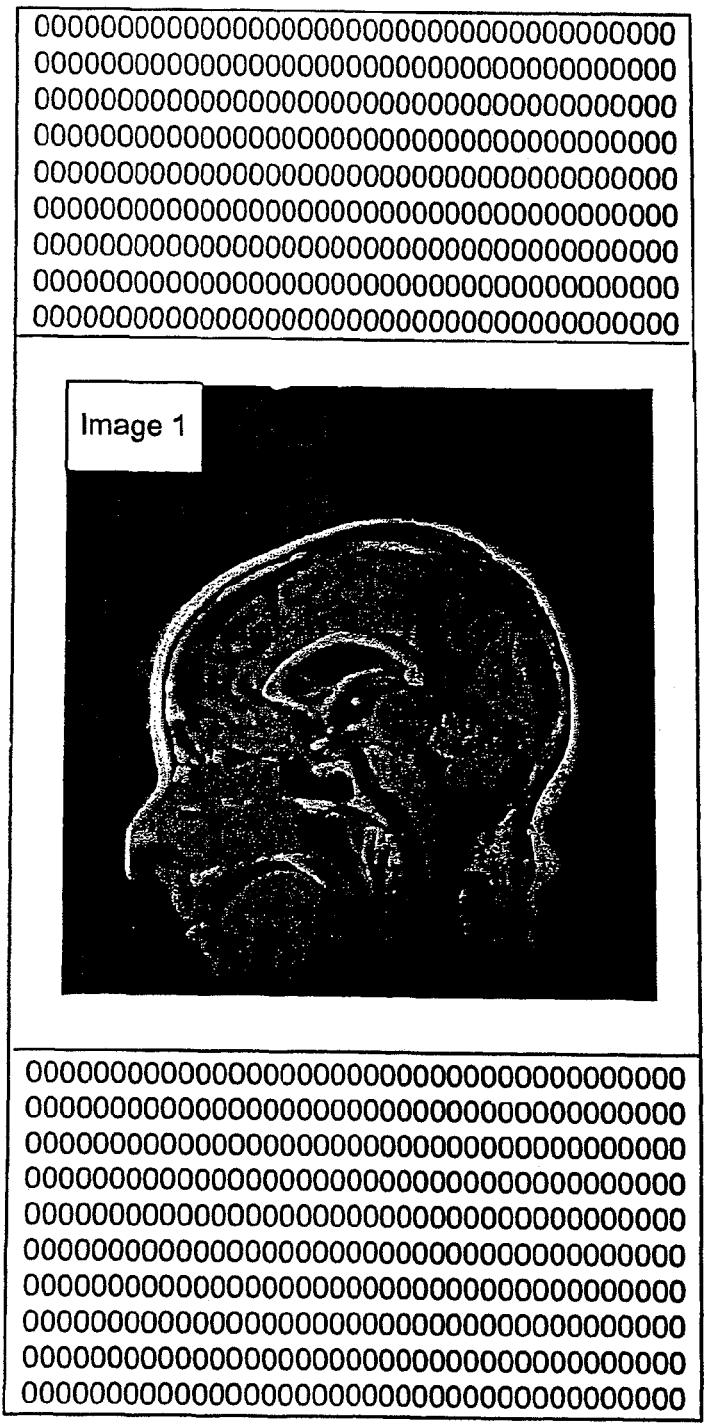
Figure 4C:
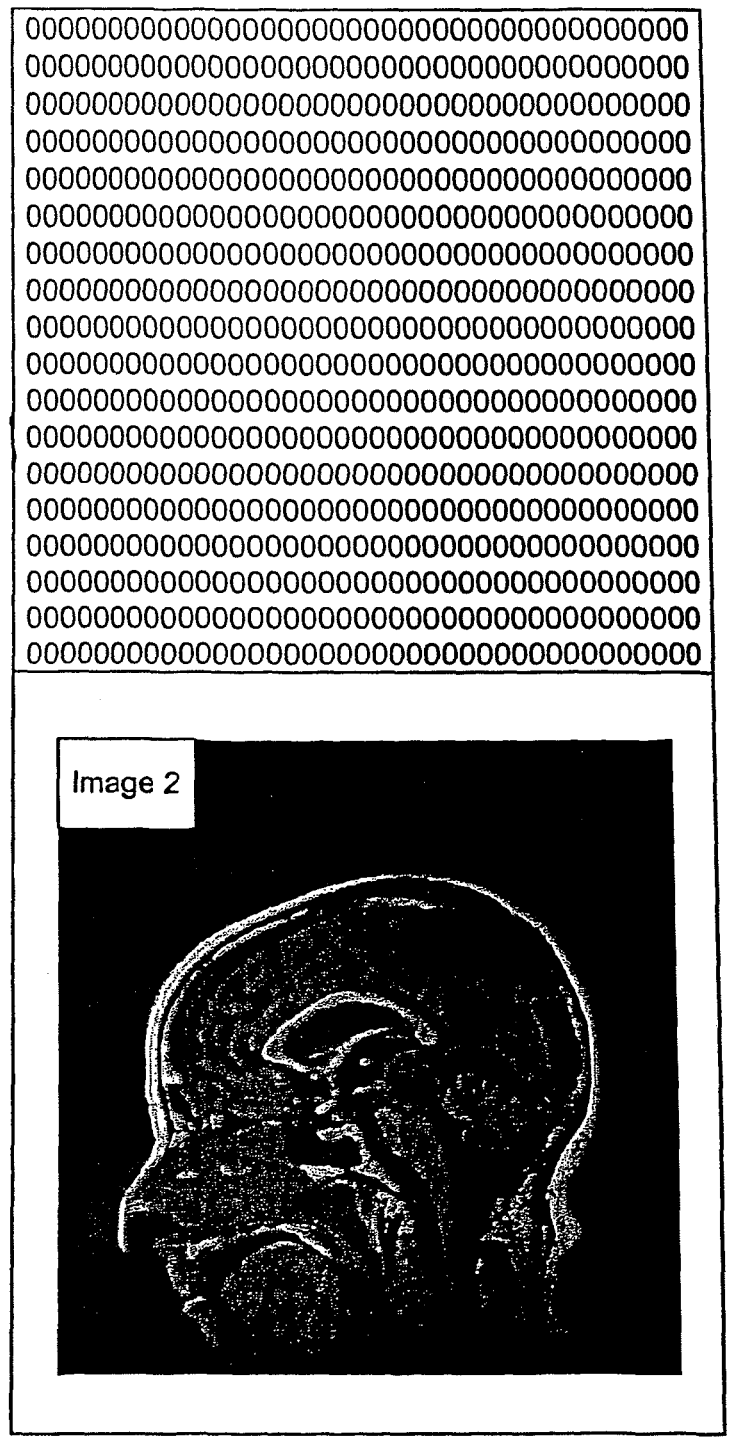
Figure 4D:
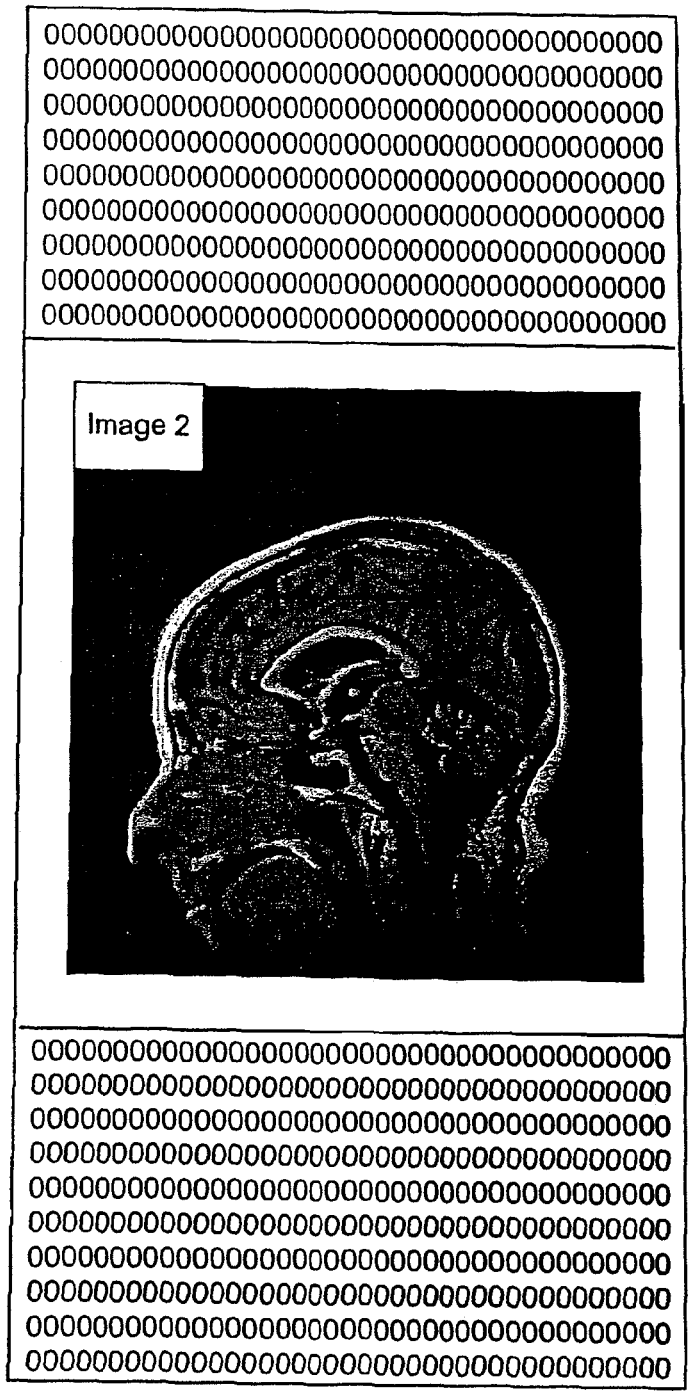
Figure 5:
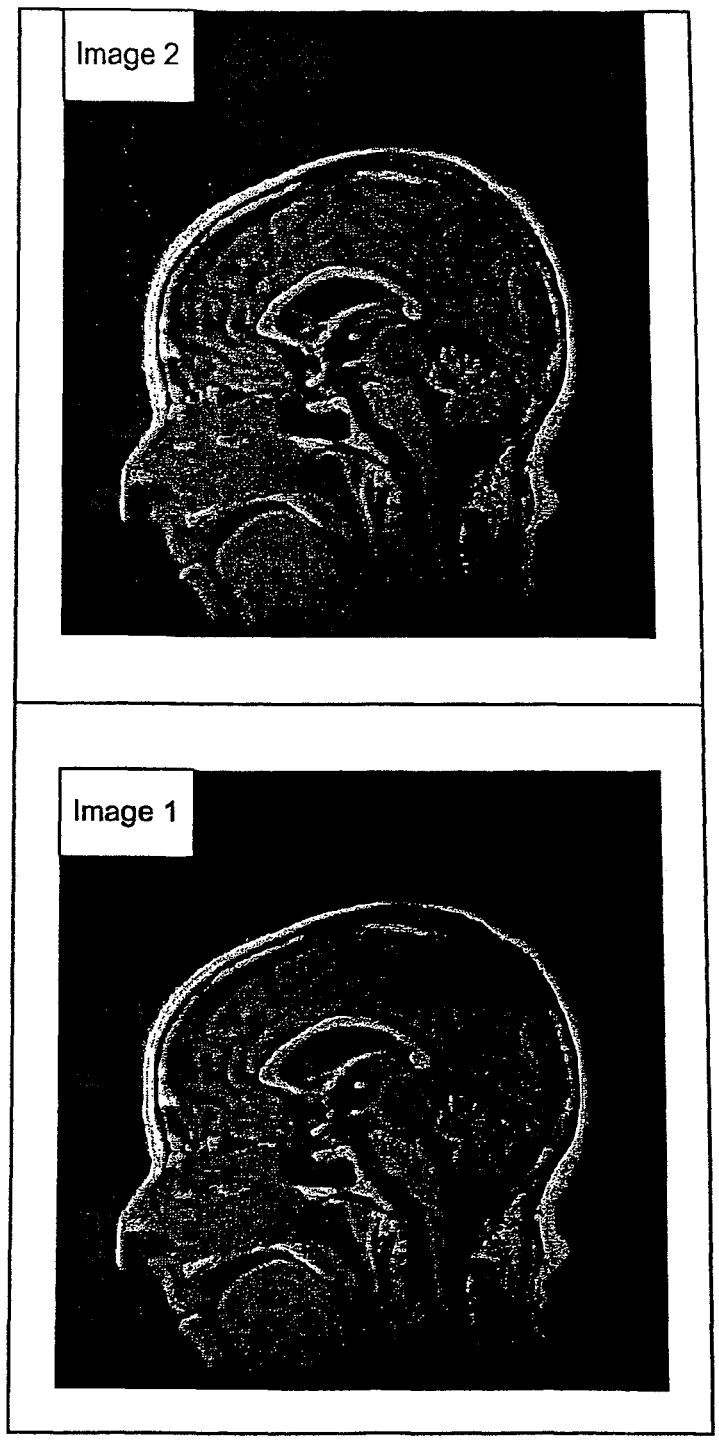
FIG. 5 shows the two artifact-free composite images after the final reconstruction.

Once the N scans are completed in step 220, the images are reconstructed in step 230. Scan 1 yields two images displaced M/2 pixels apart, as shown in FIGS. 3A and 3B. The images have stimulated echo artifacts. The other scans yield two images, also with artifacts as shown in FIGS. 3C and 3D.

Figure 2B:
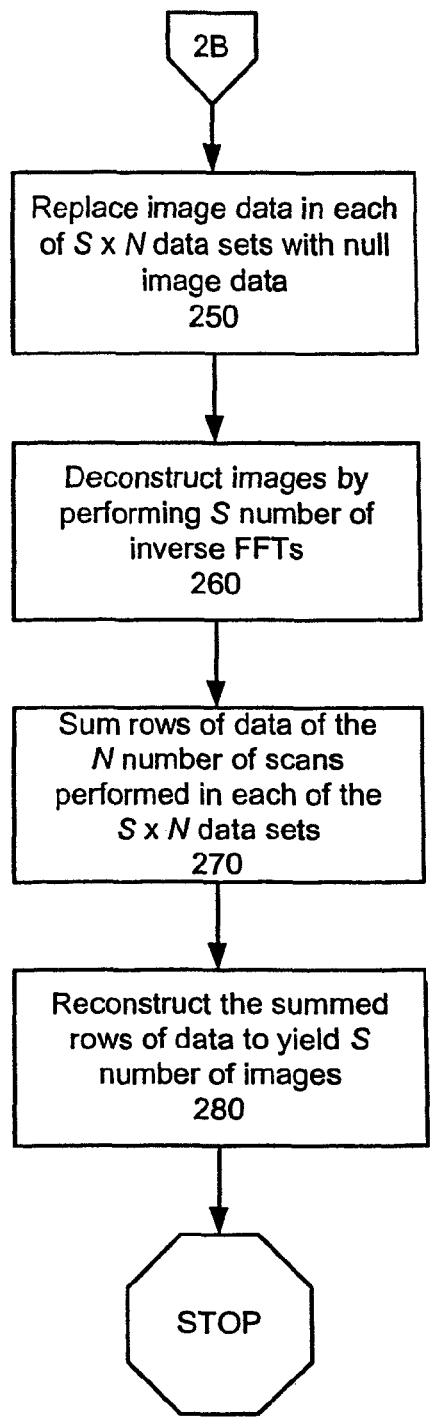

Returning to FIG. 2A, in step 240, the present invention then separates the two images into two separate data files. With reference now to FIG. 2B which continues the steps of FIG. 2A, in step 250, for each data file, one of the images is replaced by null values (that is, zeroes). This is shown in the images of FIGS. 4A, 4B, 4C, and 4D. In the case where more than two slices (images) are acquired, for example, S number of slices (images), the S number of images are separated into individual files, and all but one image in each file is replaced by null values. The separation occurs after reconstruction, that is, after two Fourier transforms have been performed on the acquired MRI data sets to create image data.

After the images are separated into two data files, and the null substitution is performed, in step 260 the images are deconstructed by the invention performing two inverse Fourier Transforms to produce two data sets, one for each slice. There are now a total of eight data sets, four for each slice.

In step 270, the invention then sums the four data sets for each slice. For each phase encoding (warp) level, four rows of data are summed, one from each scan. Each image is generated from spins within a discrete band of resonant frequencies. In step 280, the summed data are reconstructed to produce images representing the two slices initially scanned. By performing the reconstruction in this manner, two images are produced, each with greatly reduced artifacts. A similar result is evident when the zeroth DFT component is processed.

If more than two slices are desired, for example, four, Table 1 can be replaced by Table 2 below:

TABLE 2

| Scan | Slice | | | |
|---|---|---|---|---|
| | 1 | 2 | 3 | 4 |
| 1 | 0 | 90 | 180 | 270 |
| 2 | 90 | 180 | 270 | 0 |
| 3 | 180 | 270 | 0 | 90 |
| 4 | 270 | 0 | 90 | 180 |

In general, for N scans and S slices:

$$\Psi_{jk} = 2\pi(j/N + k/S)$$

where j is the scan number and k is the slice number and ψ is the phase advance per TR. This method optimizes the MRI image quality per unit of time, significantly shortening the length of scan time.

The present invention thus presents a significant advancement over previous multi-slice techniques by reducing artifacts in images. By incorporating a phase advancement technique used in FISP MRI into a multi-slice technique used in POMP MRI, the MRI has both a shortened scan time of a multi-slice technique and a reduced-artifact imaging of a FISP technique.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A method of multislice fast magnetic resonance imaging comprising:
   exciting, by a magnetic resonance imaging signal generator, at least two slices offset from one another;
   repeating said exciting of said at least two slices at least once with phase-encoding gradient signals, wherein the phase of said phase-encoding gradient signals being modified at each repeating, wherein respective signals are received for each slice excitation, creating a first image data set for each respective slice;
   transforming the respective first image data sets for each said slice into separate image data sets;
   replacing, for each said slice, at least one of said separate image data sets with null values;
   inverse transforming the respective first data image sets and separate image sets for each said slice; and
   combining, for each slice, the respective inverse transformed data sets,
   thereby creating respective images representing said slices.

2. The method according to claim 1, wherein said method is performed by an open MRI apparatus.

3. The method according to claim 1, wherein the phase-encoding gradient signals are composite RF pulses.

4. The method according to claim 1, wherein said transforming and inverse transforming comprise Fourier methods.

5. The method according to claim 1, wherein said combining comprises summing rows of k-space data created in said inverse transforming of the first image data sets and the separate image data sets.

6. The method according to claim 1, wherein said phase is incremented per each excitation by 360 degrees divided by the number of said slices.

7. The method according to claim 6, wherein said phase increment is zero degrees for a first of said imaging slices.

8. The method according to claim 1, wherein said at least two slices comprises two respective imaging slices.

9. The method according to claim 1, wherein said at least two slices comprises N respective imaging slices, S scans are performed and N×S data files are generated therefrom.

10. The method according to claim 1, wherein said transforming transforms the respective first image data sets for each said slice into at least two separate image data sets.

11. The method according to claim 1, further comprising:
    forming a k-space matrix of said first image data sets.

12. The method according to claim 11, wherein said combining comprises:
    summing respective rows of said k-space matrix.

13. A magnetic resonance imaging device comprising:
    a signal generator, said signal generator generating a plurality of magnetic resonance imaging phase encoding gradient signals, exciting at least two slices offset from one another, wherein the phase of said phase-encoding gradient signals are offset from one another, wherein respective signals are received for each slice excitation, creating a first image data set for each respective slice;
    a processor, said processor for each respective imaging slice in each said first image data set transforming the respective first image data sets for each slice into separate image data sets, and nulling out at least one of said separate image data sets with null values;
    said processor inverse transforming the respective first data image sets and separate image sets for each said slice; and combining, for each slice, the respective inverse transformed data sets,
    thereby creating respective images representing said slices.

14. The magnetic resonance imaging device according to claim 13, wherein said device is an open MRI device.

15. The magnetic resonance imaging device according to claim 13, wherein the phase-encoding gradient signals are composite RF pulses.

16. The magnetic resonance imaging device according to claim 15, wherein said transforming and inverse transforming comprise Fourier methods.

17. The magnetic resonance imaging device according to claim 13, wherein said combining comprises summing rows of k-space data created in said inverse transforming of the first image data sets and the separate image data sets.

18. The magnetic resonance imaging device according to claim 13, wherein said phase is incremented per each excitation by 360 degrees divided by the number of said slices.

19. The magnetic resonance imaging device according to claim 18, wherein said phase increment is zero degrees for a first of said imaging slices.

20. The magnetic resonance imaging device according to claim 13, wherein said at least two slices comprises two respective imaging slices.

21. The magnetic resonance imaging device according to claim 13, wherein said at least two slices comprises N respective imaging slices, S scans are performed and N×S data files are generated therefrom.

22. The magnetic resonance imaging device according to claim 13, wherein said transforming transforms the respective first image data sets for each said slice into at least two separate image data sets.

23. The magnetic resonance imaging device according to claim 13, further comprising:

forming a k-space matrix of said first image data sets.

24. The magnetic resonance imaging device according to claim 13, wherein said combining comprises:

summing respective rows of said k-space matrix.

\* \* \* \* \*